US012146795B2

(12) United States Patent
French et al.

(10) Patent No.: US 12,146,795 B2
(45) Date of Patent: Nov. 19, 2024

(54) TEMPERATURE MONITORING

(71) Applicant: Lam Research Corporation, Fremont, CA (US)

(72) Inventors: David Michael French, Fort Myers, FL (US); Christopher-James Parker, Beaverton, OR (US); Keith Joseph Batryn, Wilsonville, OR (US); Dirk Rudolph, Dundee, OR (US)

(73) Assignee: Lam Research Corporation, Fremont, CA (US)

( * ) Notice: Subject to any disclaimer, the term of this patent is extended or adjusted under 35 U.S.C. 154(b) by 192 days.

(21) Appl. No.: 17/777,738

(22) PCT Filed: Nov. 11, 2020

(86) PCT No.: PCT/US2020/060023
§ 371 (c)(1),
(2) Date: May 18, 2022

(87) PCT Pub. No.: WO2021/101772
PCT Pub. Date: May 27, 2021

(65) Prior Publication Data
US 2022/0404208 A1  Dec. 22, 2022

Related U.S. Application Data

(60) Provisional application No. 62/937,739, filed on Nov. 19, 2019.

(51) Int. Cl.
*G01J 5/061* (2022.01)
*G01J 5/10* (2006.01)

(52) U.S. Cl.
CPC ............... *G01J 5/061* (2013.01); *G01J 5/10* (2013.01)

(58) Field of Classification Search
CPC ...... G01J 5/061; G01J 5/10; G01J 2005/0077; G01J 5/0007; G01J 2005/063; H01L 21/67248
See application file for complete search history.

(56) References Cited

U.S. PATENT DOCUMENTS

| 2004/0061057 A1* | 4/2004 | Johnson ................. G01K 11/00 250/341.1 |
| 2015/0219499 A1 | 8/2015 | Waldmann et al. |
| 2015/0226611 A1 | 8/2015 | Busche et al. |

FOREIGN PATENT DOCUMENTS

| CN | 106226349 A | 12/2016 |
| CN | 114729837   | 7/2022  |

(Continued)

OTHER PUBLICATIONS

"International Application Serial No. PCT US2020 060023, International Preliminary Report on Patentability mailed Jun. 2, 2022", 6 pgs.

(Continued)

*Primary Examiner* — David P Porta
*Assistant Examiner* — Meenakshi S Sahu
(74) *Attorney, Agent, or Firm* — Schwegman Lundberg & Woessner, P.A.

(57) ABSTRACT

In some examples, an array sensor temperature control system is provided. The system may include an array sensor for generating a two-dimensional image, the two-dimensional image including a plurality of pixels or cells indicative of a temperature of a monitored component; a controller for controlling a heating or cooling device to adjust the temperature of the monitored component; and an array sensor controller activated by a power source and being in communication with the array sensor and controller.

20 Claims, 11 Drawing Sheets

(56) References Cited

FOREIGN PATENT DOCUMENTS

| JP | H04174327 A | 6/1992 |
|---|---|---|
| JP | H0829543 A | 2/1996 |
| JP | 2023502601 A | 1/2023 |
| WO | WO-2016069808 A1 | 5/2016 |

OTHER PUBLICATIONS

International Application Serial No. PCT/US2020/060023, International Search Report mailed Mar. 4, 2021, 7 pgs.
International Application Serial No. PCT/US2020/060023, Written Opinion mailed Mar. 4, 2021, 4 pgs.
Japanese Application Serial No. 2022-527674, Notification of Reasons for Refusal mailed Sep. 3, 2024, w/ English Translation, 6 pgs.

* cited by examiner

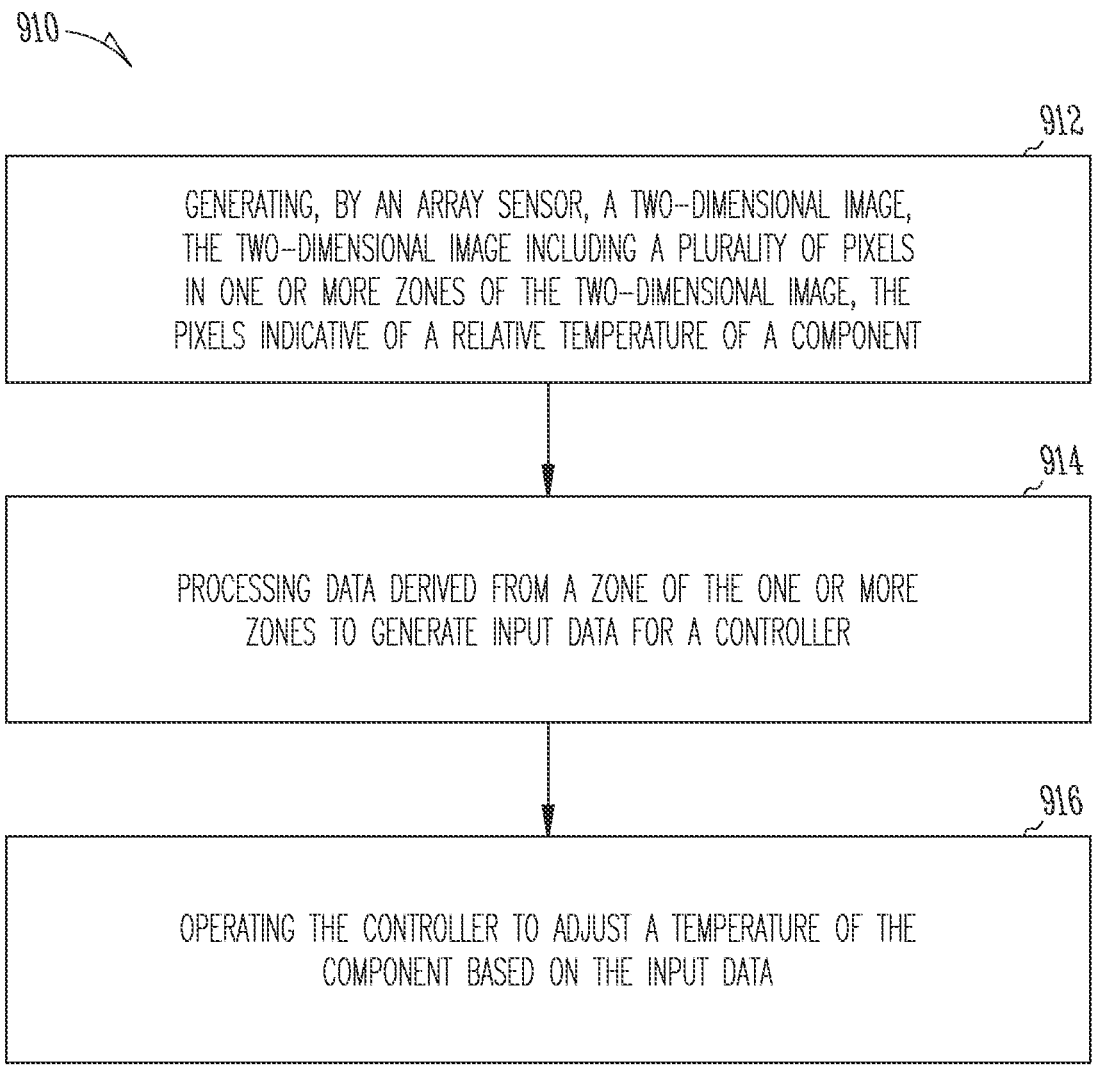

TEMPERATURE MONITORING

This application is a U.S. National Stage Filing under 35 U.S.C. 371 from International Application No. PCT/US2020/060023, filed on Nov. 11, 2020, and published as WO 2021/101772 A1 on May 27, 2021, which claims the benefit of priority to U.S. Patent Application Ser. No. 62/937,739, filed on Nov. 19, 2019, each of which is incorporated by reference herein in its entirety.

CLAIM OF PRIORITY

This application claims the benefit of priority to U.S. Patent Application Ser. No. 62/937,739, filed on Nov. 19, 2019, which is incorporated by reference herein in its entirety.

FIELD

The present disclosure generally relates to temperature monitoring, and in some examples to temperature monitoring of components in high electromagnetic interference (EMI) environments in semiconductor manufacturing applications and substrate processing.

BACKGROUND

In most substrate processing tools, when radio frequency (RF) power is energized the temperature of some components rises. This temperature rise can change their impedance and, in turn, affect process parameters and defect performance. Existing RF filters attempt to minimize temperature coefficients of RF components, but some thermal response still exists. Some systems employ cooling fans which run continuously resulting in relatively cold temperatures when no RF power is on and relatively warm, sub-optimal temperatures when RF power is applied.

Other conventional methods of temperature measurement such as temperature controllers (TCs), thermistors, or resistance temperature detectors (RTDs) face challenges in making direct temperature measurements. For example, the data collected is subject to noise and may require significant filtering or processing in order to be useful. On the other hand, current technology for remote temperature control of circuit or systems relies on spatially averaged measurements that employ remote IR detectors or single point measurements obtained using narrow width remote IR detectors. In the case of single point measurement, it is a challenge to determine if a local temperature at a given location is rapidly rising or falling, for example. The single point may in fact be a data outlier as the specific temperature for that location may be hidden in an average temperature that includes lower surrounding temperatures. In the case of a narrow width detector, while it may be possible to monitor the temperature of a single location relatively more accurately, it is often not possible to recognize if a temperature in a nearby region has changed in an undesired way.

In other conventional approaches, an optical pyrometer uses a fiber optic sensor as a temperature detector, but here the temperature detection system requires a heat sensor for each component for which the temperature is to be measured. Moreover, the fiber optical cables often require careful routing or control as there are limits to the bend radius of such cables.

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

Some examples employ an array detector as a thermal monitor. The array detector is two-dimensional in the sense that it can thermally observe a two-dimensional area, as opposed merely to a point location. In some examples, the observed two-dimensional area is divided into zones. Data collected from each zone may be processed separately, or at least be processed to generate data specific to each zone. A plurality of zones may be mosaiced or otherwise combined to monitor a large region that may include a great number of thermally-sensitive devices, for example. Such coverage is not generally possible with a conventional point detector. Additionally, in some cases where many components need to be monitored simultaneously, an array sensor provides all of the information with a single detector, rather than requiring multiple sensors for different components. Arrangements disclosed herein can be vastly more efficient than single point temperature or heat detectors. It will be appreciated that although example embodiments have been described in the context of EMI environments, other applications are possible. For example, some tools or substrate processing systems do not use RF power. Other power sources or processing systems are possible. Some features of two-dimensional temperature measurement as described herein may be useful in the light of specific mechanical or chemical challenges presented by alternate systems or processes.

In some cases, it may be beneficial to control the temperature of multiple components at the same time. Since an array sensor provides a means of measuring the temperature over a large area, multiple temperature control devices such as fans, heaters, or cooling systems can be controlled using a single array sensor rather than using individual point sensors or a system that includes a sensor for each component.

In some examples, data collected by an array detector is fed into a controller, which is configured to initiate operation of a temperature control device (for example, a fan operated to hold a given temperature at a predetermined set point). The controller can control cooling and/or heating as needed in order to provide a constant temperature environment. In some cases, tool components have a thermal dependence, yet by controlling the thermal environment, such dependence can, in some examples, be rendered unimportant as the components critical to system performance are maintained at a constant temperature. Thermal data can be aggregated. In using a thermal two-dimensional "picture," a thermal fingerprint of a system can be established and monitored over time.

A single array sensor generally imposes minimal alignment or aiming requirements. Since the wiring for a single sensor (as opposed to many sensors) is relatively simple, packaging and ancillary costs are reduced. Moreover, remote temperature measurement is possible with reduced or no need to attach sensors directly to components being placed under observation.

In some examples, an ability to monitor the temperature of multiple components, devices, or machines simultaneously with one zoned sensor allows "fingerprinting" of an entire or partial system or circuit. For example, a printed circuit board (PCB) that has many components can be thermally monitored in order to determine an operational health of the PCB. For example, a particular pixel in a given zone may be related to a particular operational component in the PCB. The component is measured or monitored over time. An error status can be generated to check the component if the pixel turns "hot" or "cold" compared to a benchmark fingerprint. This real-time fingerprinting allows precise troubleshooting of otherwise hard to diagnose issues and can provide significant time savings.

In cases where system operating conditions or components may change over time, a flexible array sensor-based control and monitoring system (also termed an array sensor temperature monitoring system, herein) can adapt to what is sought to be controlled. For example, pixel A may initially be configured to monitor a highest temperature of a critical component thermally controlled by a fan having a closed loop control (for example). After a period, a system or circuit containing the component may be used for a different process or designated to operate under different conditions. Another component corresponding to pixel D may instead be designated as the most critical component. The priority change can be accommodated with ease, as the flexible array sensor-based control and monitoring system can be reconfigured without hardware changes. This may add significant capability and control over conventional systems and allow for continuous improvement of monitored systems over time.

Thus, in some examples an array sensor temperature control system comprises an array sensor to generate a two-dimensional image, the two-dimensional image including a plurality of pixels indicative of a temperature of a component; a controller to control a heating or cooling device to adjust the temperature of the component; and an array sensor controller activated by a power source and in communication with the array sensor and controller.

In some examples, the two-dimensional image includes a representation of the component.

In some examples, the two-dimensional image includes one or more zones.

In some examples, the component is one of a plurality of components; and each zone of the one or more zones corresponds to a component in the plurality of monitored components.

In some examples, each zone of the one or more zones includes pixels associated with a specific component represented in each zone.

In some examples, each zone of the one or more zones includes pixels associated with a specific component in a specific thermal area of a zone.

In some examples, the one or more zones are associated with a size, area, or location of the component in the plurality of components.

In some examples, a zone of the one or more zones is associated with the controller.

In some examples, the component is one of a plurality of components, and the controller is one of a plurality of controllers, each controller in the plurality of controllers controlling a respective heating or cooling device to adjust the temperature of a respective component, each zone of the one or more zones associated with a controller among the plurality of controllers, the system controlling temperature based on temperature data generated by a single two-dimensional image that includes the one or more zones therein.

In some examples, the temperature data generated by the single two-dimensional image is transmitted as feedback to a data processor included in at least one controller in the plurality of controllers.

In some examples, the feedback data is compared, by the data processor, against benchmark temperature data.

Some examples include substrate processing systems. For example, a substrate processing system may comprise a processing chamber; a power source for the processing chamber, and a temperature control system for regulating a temperature of a component of the substrate processing system, the temperature control system comprising: an array sensor to generate a two-dimensional image, the two-dimensional image including a plurality of pixels indicative of a temperature of the component a controller to control a heating or cooling device to adjust the temperature of the component; and an array sensor controller in communication with the array sensor and controller.

In some examples, the two-dimensional image includes a representation of the component.

In some examples, the two-dimensional image includes one or more zones.

In some examples, the component is one of a plurality of components; and each zone of the one or more zones corresponds to a component in the plurality of monitored components.

In some examples, each zone of the one or more zones includes pixels associated with a specific component represented in each zone.

In some examples, each zone of the one or more zones includes pixels associated with a specific component in a specific thermal area of a zone.

In some examples, the one or more zones are associated with a size, area, or location of the component in the plurality of components.

In some examples, a zone of the one or more zones is associated with the controller.

In some examples, the component is one of a plurality of components; and the controller is one of a plurality of controllers, each controller in the plurality of controllers controlling a respective heating or cooling device to adjust the temperature of a respective component, each zone of the one or more zones associated with a controller among the plurality of controllers, the system controlling temperature based on temperature data generated by a single two-dimensional image that includes the one or more zones therein.

In some examples, the temperature data generated by the single two-dimensional image is transmitted as feedback to a data processor included in at least one controller in the plurality of controllers.

In some examples, the feedback data is compared, by the data processor, against benchmark temperature data.

BRIEF DESCRIPTION OF THE DRAWINGS

Some embodiments are illustrated by way of example and not limitation in the views of the accompanying drawing:

FIGS. 9A-9B depict flow charts of example operations in methods, according to example embodiments.

DESCRIPTION

Figure 1:
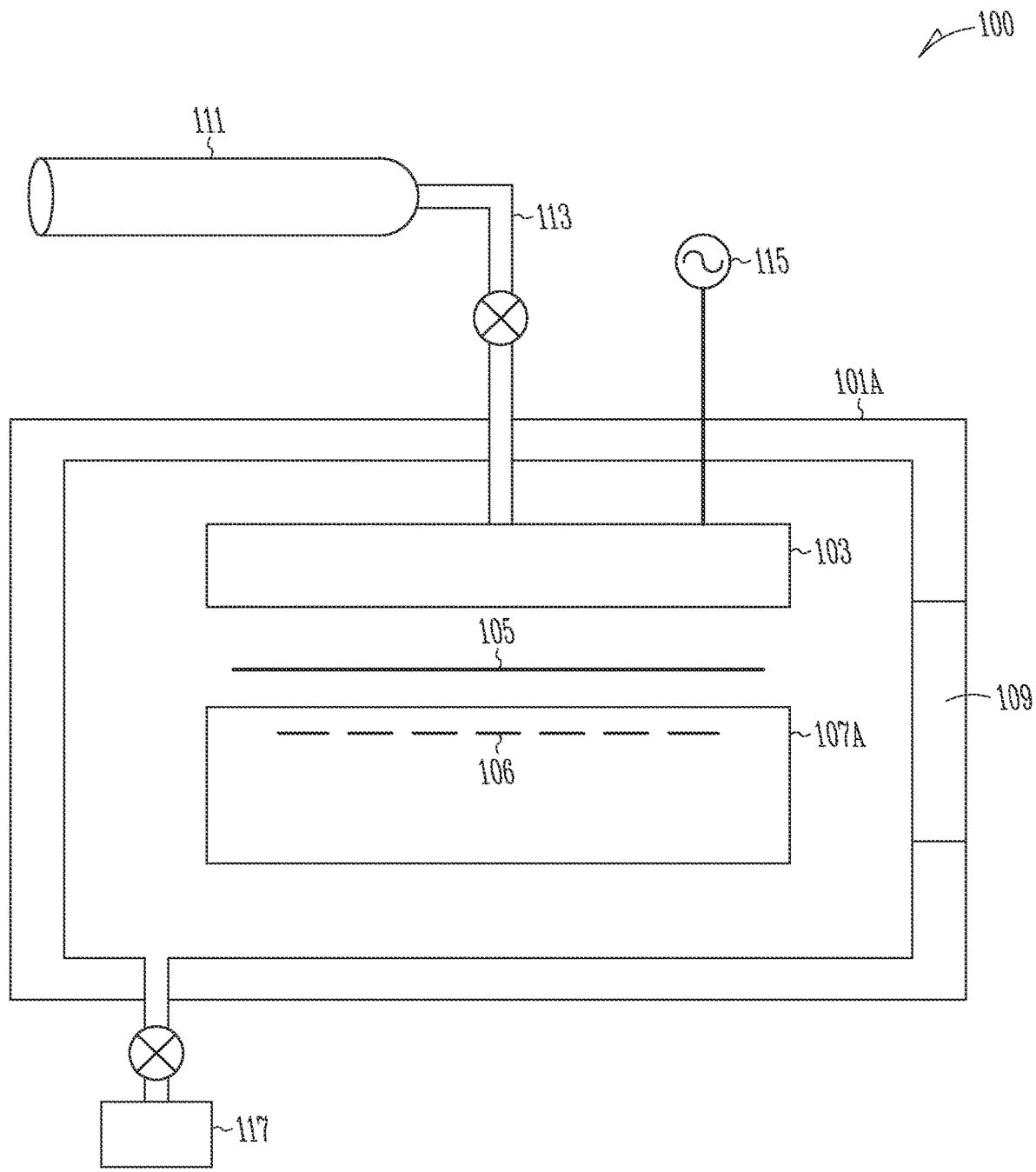
FIG. 1 shows a simplified example of a plasma-based processing chamber, which can include a substrate-support assembly comprising an electrostatic chuck (ESC) that may be used with the disclosed subject matter.

The description that follows includes systems, methods, techniques, instruction sequences, and computing machine program products that embody illustrative embodiments of the present disclosure. In the following description, for purposes of explanation, numerous specific details are set forth in order to provide a thorough understanding of example embodiments. It will be evident, however, to one skilled in the art that the present disclosure may be practiced without these specific details.

A portion of the disclosure of this patent document may contain material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever. The following notice applies to any data as described below and in the drawings that form a part of this document: Copyright Lam Research Corporation, 2020, All Rights Reserved.

With reference now to FIG. 1, a simplified example of a plasma-based processing tool 100 is shown. FIG. 1 is shown to include a plasma-based processing chamber 101A in which a showerhead electrode 103 and a substrate-support assembly 107A are disposed. Typically, the substrate-support assembly 107A provides a substantially-isothermal surface and may serve as both a heating element and a heat sink for a substrate 105. The substrate-support assembly 107A may comprise an electro-static chuck (ESC) in which heating elements 106 are included to aid in processing the substrate 105. The substrate 105 may be a wafer comprising elemental semiconductors (e.g., silicon or germanium), a wafer comprising compound elements (e.g., gallium arsenide (GaAs) or gallium nitride (GaN)), or variety of other substrate types including conductive, semi conductive, and non-conductive substrates. The plasma-based processing chamber may have several water-cooled components.

In operation, the substrate 105 is loaded through a loading port 109 onto the substrate-support assembly 107A. A gas line 113 supplies one or more process gases to the showerhead electrode 103. In turn, the showerhead electrode 103 delivers the one or more process gases into the plasma-based processing chamber 101A. A gas source 111 to supply the one or more process gases is coupled to the gas line 113. An RF power source 115 is coupled to the showerhead electrode 103 or to the substrate-support assembly 107A.

In operation, the plasma-based processing chamber 101A is evacuated by a vacuum pump 117. RF power is capacitively coupled between the showerhead electrode 103 and a lower electrode (not shown explicitly) contained within or on the substrate-support assembly 107A. The substrate-support assembly 107A is typically supplied with two or more RF frequencies. For example, in various embodiments, the RF frequencies may be selected from at least one frequency at about 1 MHz, 2 MHz, 13.56 MHz, 27 MHz, 60 MHz, and other frequencies as desired. A coil to block or partially block a particular RF frequency can be designed as needed. Therefore, particular frequencies discussed herein are provided merely for ease in understanding.

The RF power is used to energize the one or more process gases into a plasma in the space between the substrate 105 and the showerhead electrode 103. The plasma can assist in depositing various layers (not shown) on the substrate 105. In other applications, the plasma can be used to deposit or etch device features into the various layers on the substrate 105. RF power is coupled through at least the substrate-support assembly 107A. It will be appreciated that in operation, when RF power is turned on the temperature of some components will rise. A temperature change in even a single component can change its impedance which, when combined with temperature and impedance changes in other components, can adversely and unpredictably affect process parameters and defect performance in one of a myriad ways. The present disclosure seeks or address at least some of these problems.

Figure 2:
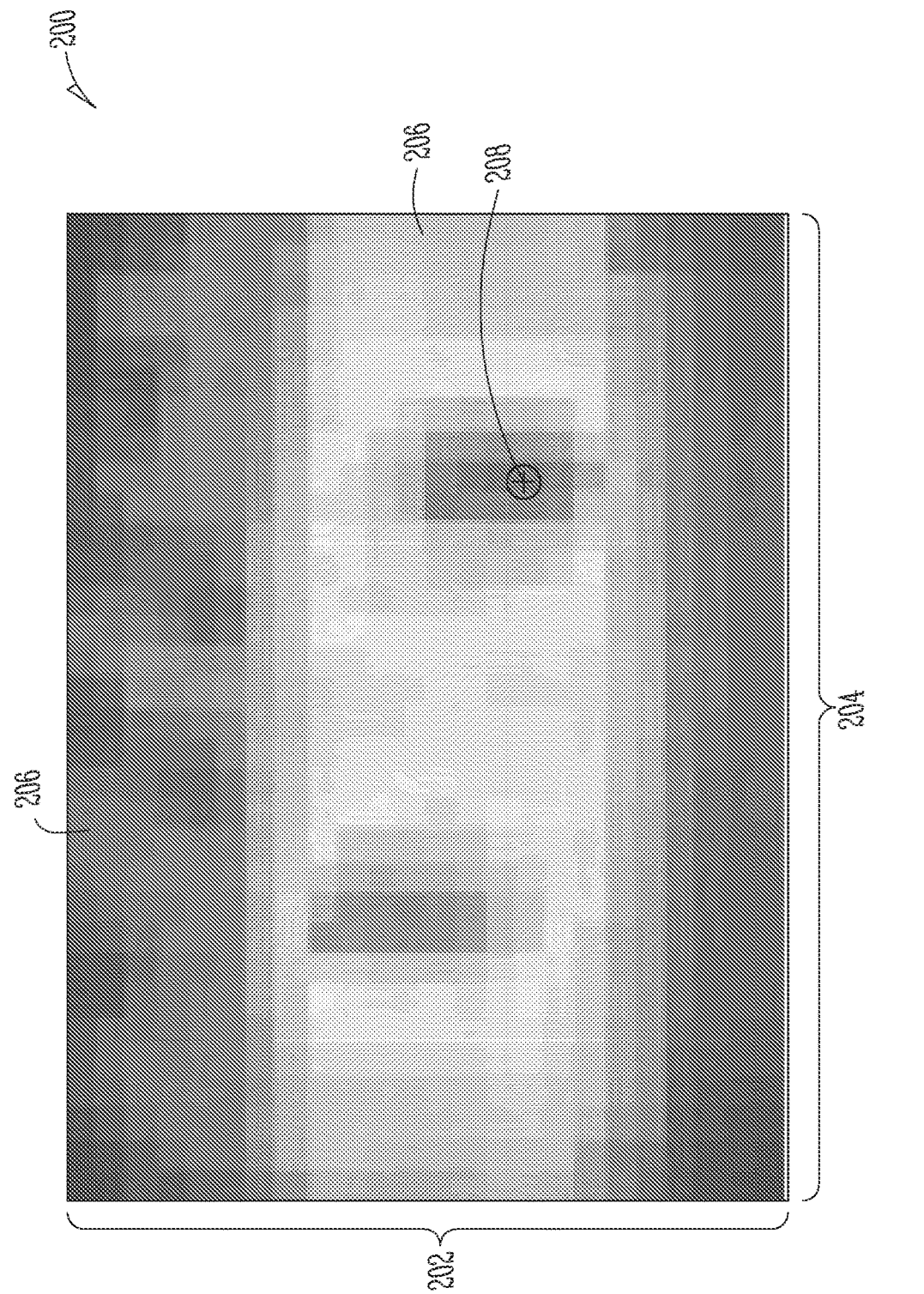
FIG. 2 illustrates a two-dimensional image generated by an array sensor, according to an example embodiment.

FIG. 2 illustrates an example two-dimensional image 200 generated by an array sensor utilised in examples of the present disclosure. The image 200 may include a field-of-view (as opposed to a point view) having a height 202 and a width 204. IR pixels (or cells) 206 monitor or generate data in relation to one or more areas of interest 208. An example array sensor temperature monitoring system (described further below) performs temperature monitoring and control operations based on inputs derived from one or more such array sensors and images.

Figure 3:
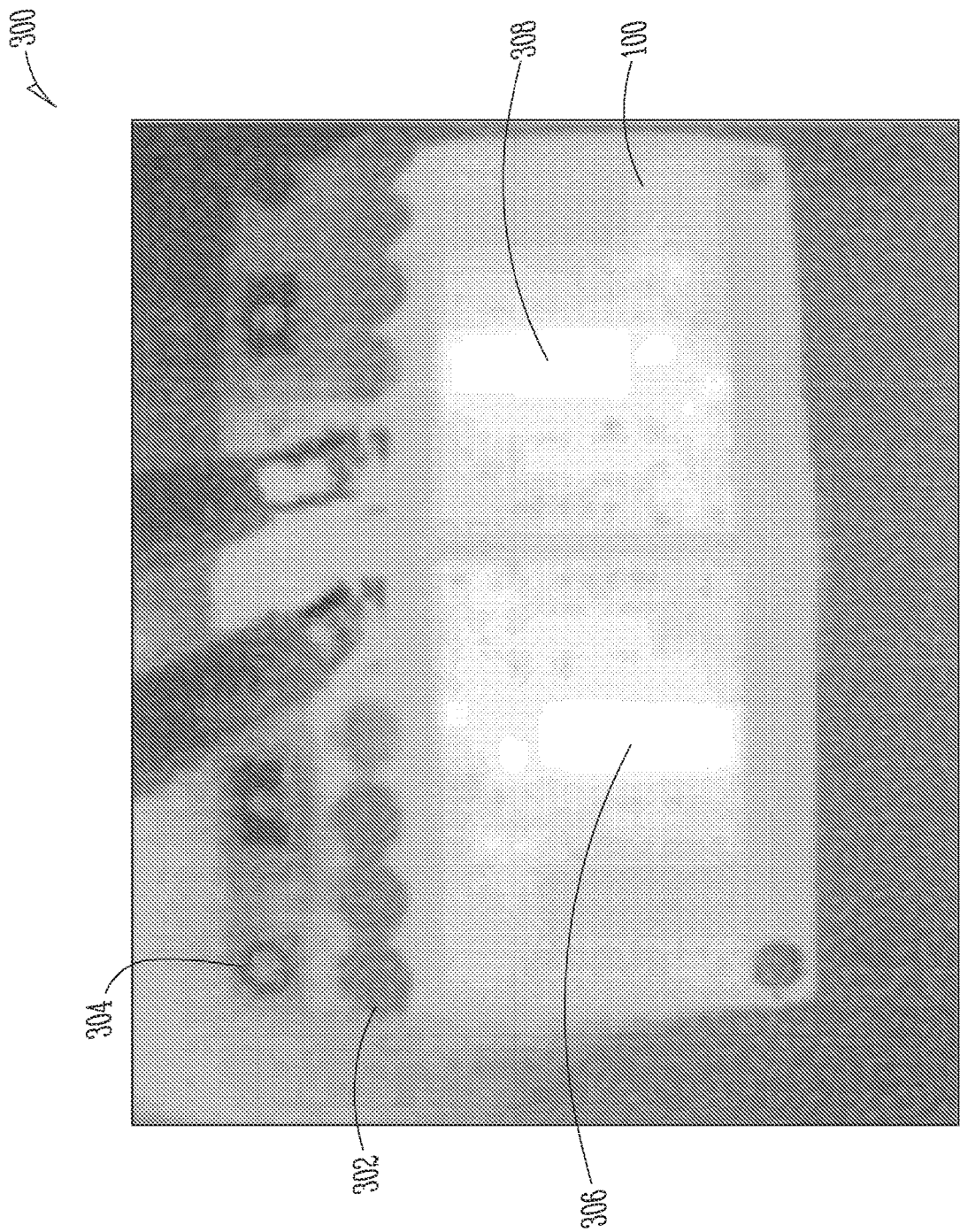
FIG. 3 illustrates a two-dimensional image generated by an array sensor, according to an example embodiment.

In some examples, complex system temperature response and control requirements can be determined based, for example, on a two-dimensional image 300 shown in FIG. 3. Some example components of a plasma-based processing tool 100 may be discerned in the two-dimensional image. An operating temperature of certain components is designated by a certain degree of shading or color in the image (for example, darker or cooler components 302 and 304). Two other components, in this example 306 and 308, might similarly be indicted by lighter shading or color as operating at extreme or very high temperatures. The high temperatures may be within or outside a fingerprint benchmark temperature.

Figure 4:
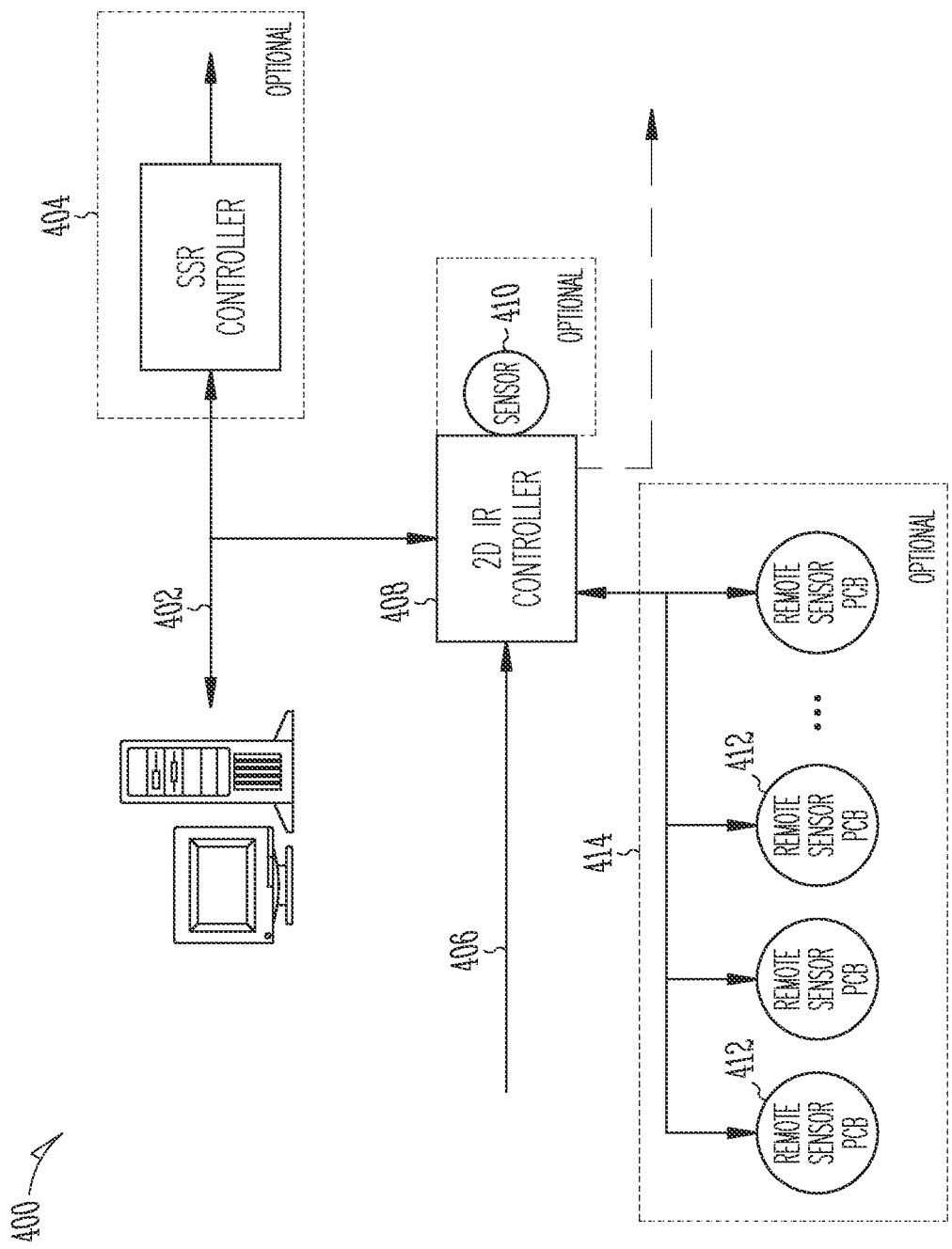
FIG. 4 is a schematic view of an array sensor temperature monitoring system, according to an example embodiment.

With reference to FIG. 4, some aspects of an example array sensor temperature monitoring system 400 are now discussed. In some examples, the system 400 includes or adopts an EtherCAT-type architecture 402 allowing direct, real-time communication between sensors and other controllers. Other system configurations are possible. One example controller may include a remote solid-state relay (SSR) controller 404 for performing heating and/or cooling operations in a monitored system. Heating or cooling operations may include a fan speed control. Other controlled operations are possible. An example monitored system 400 may include a plasma-based processing tool 100 of the type described above. Other monitored systems are possible. The system 400 may include for example EtherCAT heater controller integration allowing multiple or a maximum number of controllers possible per system 400.

Another example controller of an array sensor temperature monitoring system 400 may include an array sensor controller 408 supporting an EtherCAT Core PCB. In some examples, the array sensor controller 408 supports direct mounting of one or more IR array sensors 410 (for example, a socket or DNS (Do Not Stuff) array sensor). In some examples, the array sensor temperature monitoring system 400 includes a local power source 406. The array sensor controller 408 may include a local user feedback option and a display (not shown). In some examples, the array sensor temperature monitoring system 400 includes remote array sensor PCBs 412 in which multiple boards are connected to a connector board 414. Smaller, flexible mounting options may include multiple sensor heads associated with one array sensor controller 408.

Figure 5:
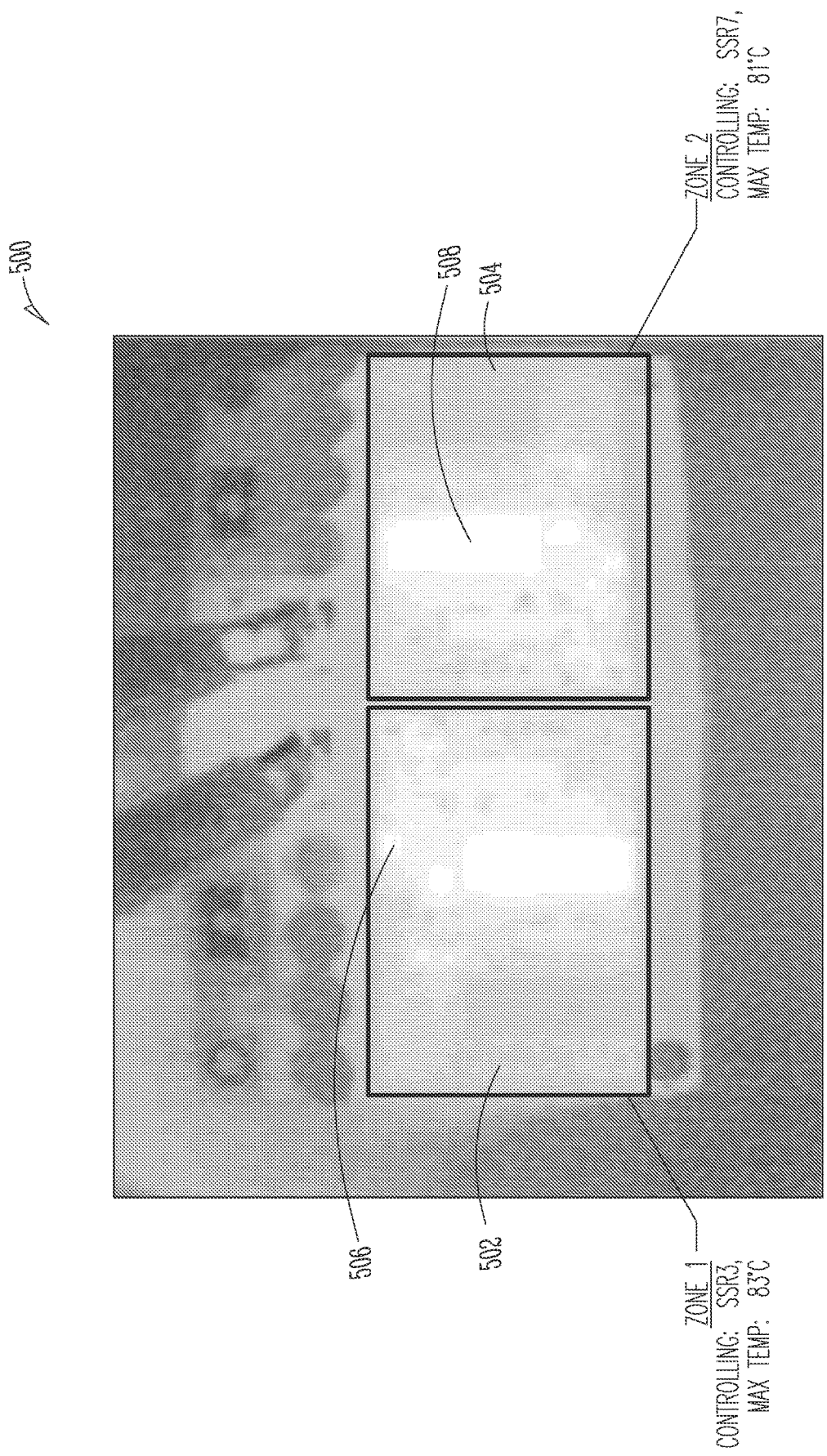
FIG. 5 illustrates an example zoned image, according to an example embodiment.

In some examples, a single two-dimensional image, for example image 300 of FIG. 3, generated by an array sensor 410 is divided into zones. An example zoned image 500 is shown in FIG. 5. Here, the image 500 includes two zones: zone 1 (502) and zone 2 (504). Other zones are possible. Each zone may include pixels or cells 506 associated with discrete components monitored in each zone or associated with a monitored area of a component 508, for example. Other arrangements are possible. The image 500 may be divided into a configurable number of areas (zones) for controlling a configurable number of heating or cooling operations for a monitored system (for example, a plasma-based processing tool 100, or a PCB). Each zone 502 and 504 may be associated with a size, area, or location. For example, zone 1 (502) may be associated with a solid-state relay (SSR) controller monitoring a component having a maximum operating temperature of 83° C. Zone 2 (504) may be associated with an SSR7 controller monitoring a component having a maximum operating temperature of 81° C. Other arrangements are possible. Of significance in some examples is that this multifaceted control is based on data generated by a single image broken into or including zones. An array sensor temperature monitoring system 400 including a zoned image 500 may assign, in relation to each zone, SSR outputs to a cooling fan, a cooling water switch, or other temperature control device, for example.

Data derived from a plurality of zones, such as zone 1 (502) and zone 2 (504), in an image 500 is transmitted as feedback to software processed by one or more controllers, for example controllers 404 and 408 discussed above. Warnings or errors may be generated based on the data concerning the thermal health or otherwise of monitored components, for example a component overheating or diverging from a normal or "fingerprint" thermal benchmark. Error messages may be generated. The performance of a temperature control device, such as a fan, may be monitored by fan performance sensors.

Figure 6:
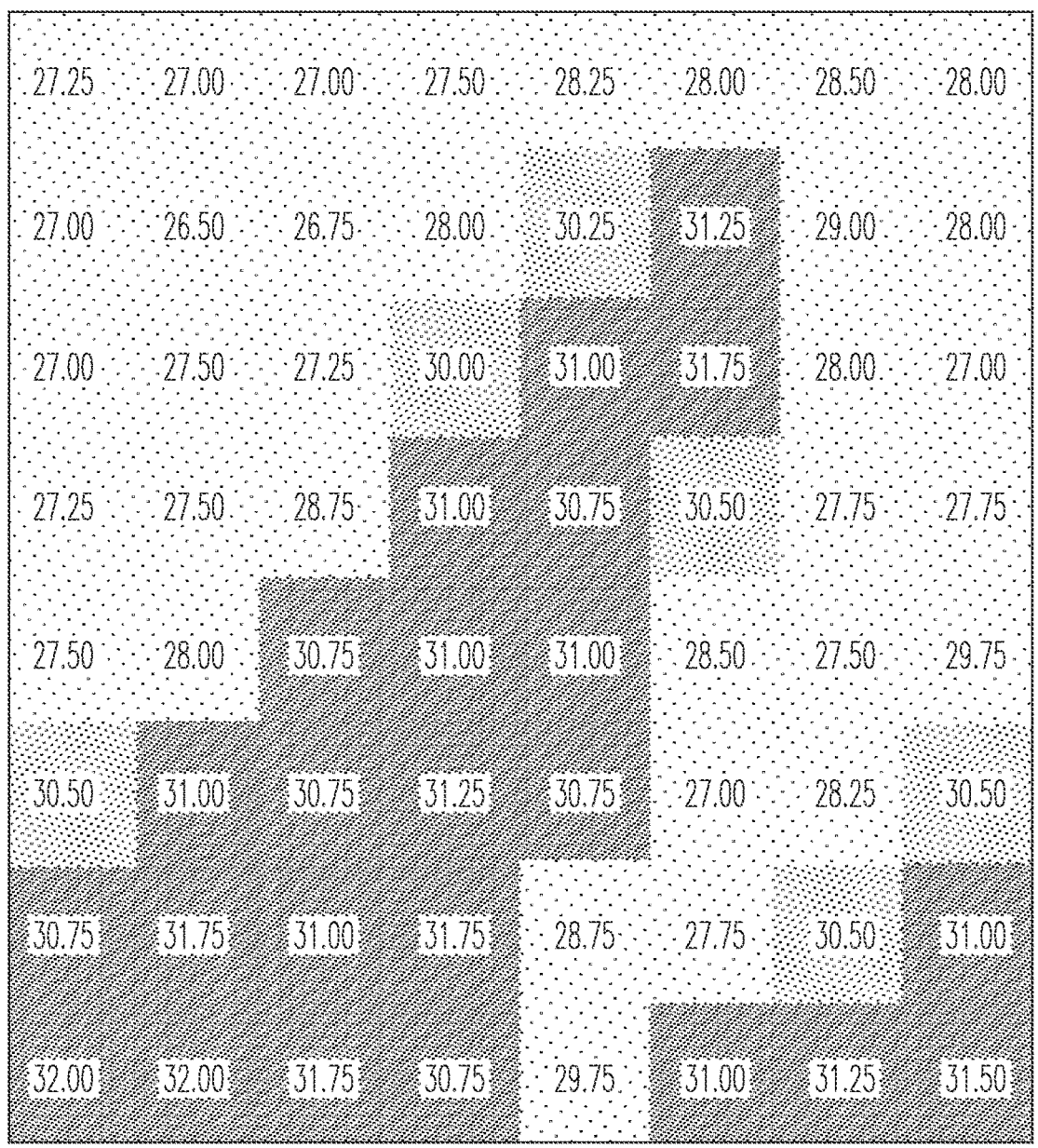
FIG. 6 illustrates an example cell-value association, according to an example embodiment.
Figure 7:
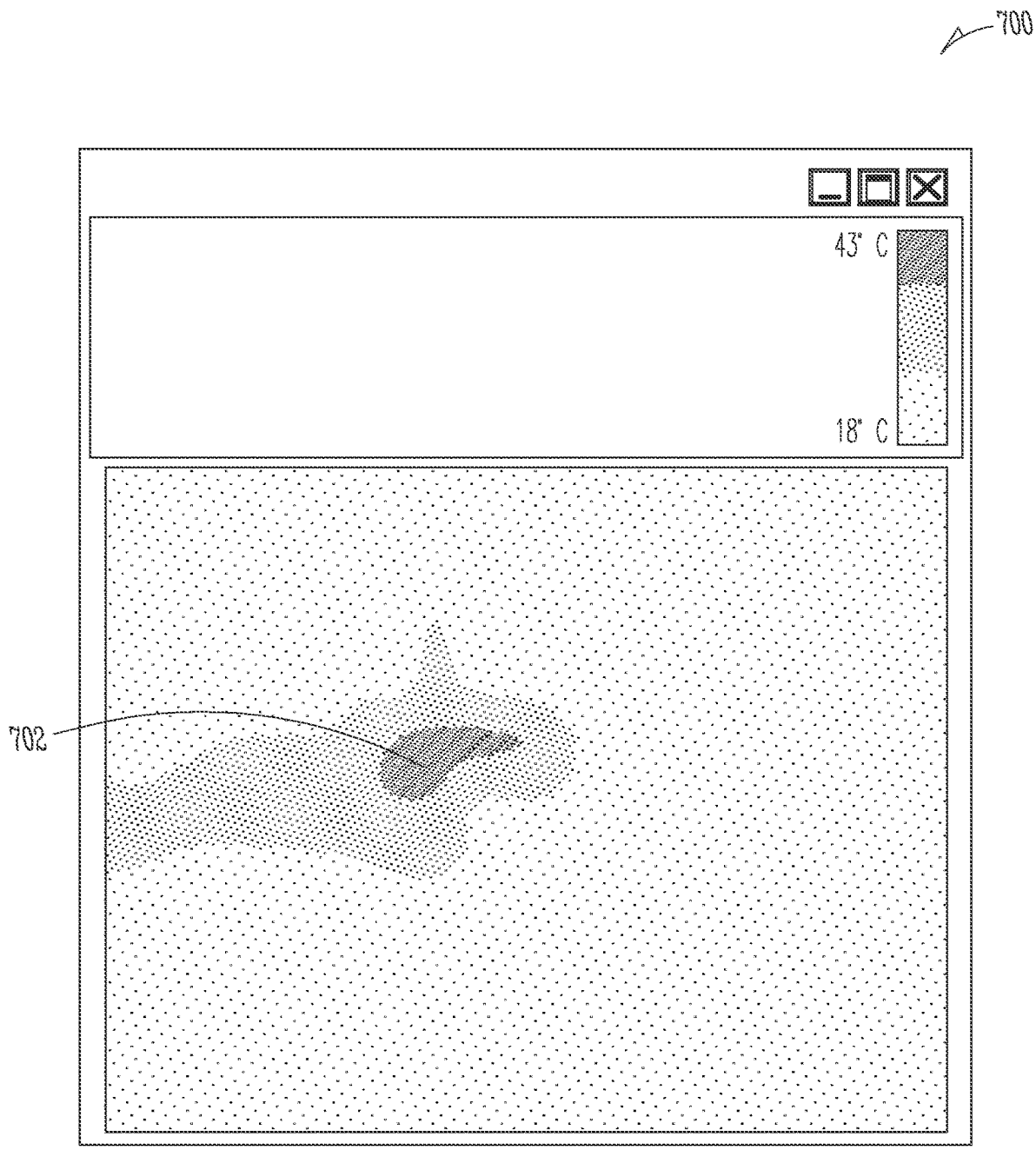
FIG. 7 illustrates an example find max result, according to an example embodiment.

In some examples, each pixel or cell in a zone is associated with a value, such as a temperature control value (for example, an adjustable emissivity based on a target to be measured). An example of such cell-value association in a zone or image 600 is shown in FIG. 6. The emissivity may be an average emissivity for all or part of the zone or a specific per-pixel emissivity for each cell or pixel in the zone (or at least some of the pixels or cells). In some examples, an array sensor controller interrogates or processes a zone (i.e., a zone associated with a monitored component, or area of a component) to determine a hottest point (i.e., cell or pixel) or multiple points in the zone to control a respective average or specific temperature of the component or area being monitored. In some examples, instead of the precision aiming typically required when using a regular point IR detector, present examples may find the hottest part of an image or zone using a simple "find max" command, for example, in a controller processing the image data. An example "find max" result 702 is shown in the image or zone 700 in FIG. 7.

In some examples of an array sensor temperature monitoring system 400, an array sensor controller 408 does not "look" at an actual image, but rather looks at (or receives) a 2D array of temperature values (after some processing) corresponding to the image pixels. The 2D array of temperature values is generated by or sourced from the army sensor 410. In some examples, the image pixels correspond to a physical location or a temperature of a component. Some images referenced in the example views presented herein have had additional image processing performed on it for example to make it meaningful to the human eye. In some examples, a "human-readable" image referenced may be available for user feedback on a localized screen or through a network on a remote computer, but in some examples the human-readable image may not have temperature control processing based upon it.

Figure 8:
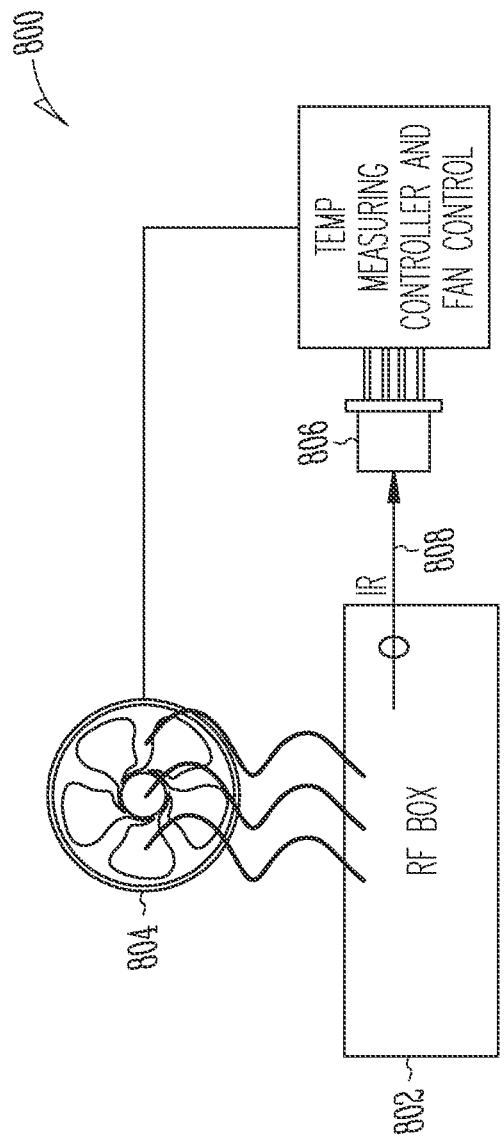
FIG. 8 illustrates an example non-contact temperature control arrangement, according to an example embodiment.

An example non-contact temperature control arrangement 800 that may be facilitated by the present subject matter is shown in FIG. 8. Since it is difficult to measure directly the temperature inside an RF enclosure due to RF coupling, a non-contact approach is made possible by the present examples. An RF box 802 (for example in plasma-based processing tool 100 above) may be cooled by a fan 804 controlled by an array sensor temperature monitoring system 400 including an array sensor 806 of the type described herein. The array sensor 806 detects infrared heat 808 generated by the RF box 802.

Figure 9A:
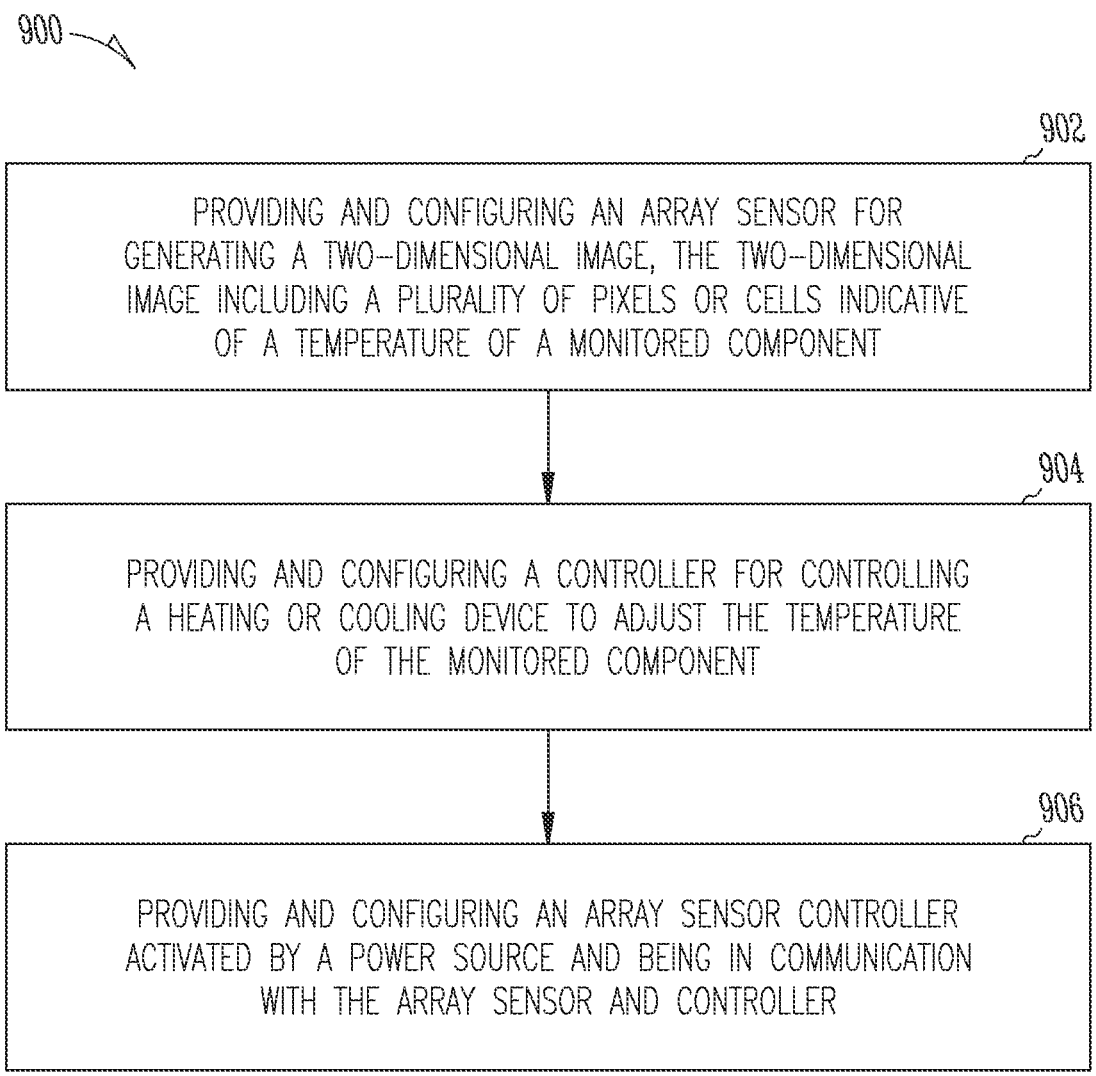

Some examples of the present subject matter include methods. With reference to FIG. 9A, a method 900 of operating an array sensor temperature control system comprises operations including at least: at 902, providing and configuring an array sensor for generating a two-dimensional image, the two-dimensional image including a plurality of pixels or cells indicative of a temperature of a monitored component; at 904, providing and configuring a controller for controlling a heating or cooling device to adjust the temperature of the monitored component; and, at 906, providing and configuring an array sensor controller activated by a power source and being in communication with the army sensor and controller.

In some examples, the operations further comprise including a representation of the monitored component in the two-dimensional image.

In some examples, the operations further comprise including one or more zones in the two-dimensional image.

In some examples, the monitored component is one of a plurality of monitored components; and each zone of the one or more zones corresponds to a monitored component in the plurality of monitored components.

In some examples, each zone of the one or more zones includes pixels or cells associated with a specific monitored component represented in each zone or associated with a thermal area of a monitored component.

In some examples, the operations further comprise associating a zone among the one or more zones with a size, area, or location of the monitored component among the plurality of monitored components.

In some examples, the operations further comprise associating a zone of the one or more zones with the controller.

In some examples, the monitored component is one of a plurality of monitored components; and the controller is one of a plurality of controllers, each controller in the plurality of controllers controlling a respective heating or cooling device to adjust the temperature of a respective monitored component, each zone of the one or more zones associated with a controller among the plurality of controllers, the system controlling temperature based on temperature data generated by a single two-dimensional image that includes the one or more zones therein.

In some examples, the operations further comprise transmitting the temperature data generated by the single two-dimensional image as feedback to a data processor included in at least one controller in the plurality of controllers.

In some examples, the feedback data is compared, by the data processor, against benchmark temperature data.

With reference to FIG. 9B, a method 910 of operating an array sensor temperature control system comprises operations including at least, at 912, generating, by an array sensor, a two-dimensional image, the two-dimensional image including a plurality of pixels in one or more zones of the two-dimensional image, the pixels indicative of a relative temperature of a component; at 914, processing data derived from a zone of the one or more zones to generate input data for a controller; and, at 916, operating the controller to adjust a temperature of the component based on the input data.

In some examples, a representation of the component is included in the two-dimensional image. In some examples, the component is one of a plurality of components; and each zone of the one or more zones corresponds to a component in the plurality of components. In some examples, each zone of the one or more zones includes pixels associated with a specific component represented in each zone. In some examples, each zone of the one or more zones includes pixels associated with a specific thermal area of a zone. In some examples, the method 910 further comprises associating a zone among the one or more zones with a size, area, or location of the component. In some examples, a zone of the one or more zones is associated with the controller.

In some examples, the component is one of a plurality of components; and the controller is one of a plurality of controllers, each controller in the plurality of controllers controlling a respective heating or cooling device to adjust the temperature of a respective component, each zone of the one or more zones associated with a controller among the plurality of controllers, the adjusted temperature based on temperature data generated by a single two-dimensional image that includes the one or more zones therein.

In some examples, the method 910 further comprises transmitting the temperature data generated by the single two-dimensional image as feedback data to a data processor included in at least one controller in the plurality of controllers. In some examples, the feedback data is compared, by the data processor, against benchmark temperature data.

Some examples include a non-transitory machine-readable medium including instructions, which when read by a machine, because the machine to perform operations including, at least: controlling an army sensor for generating a two-dimensional image, the two-dimensional image including a plurality of pixels or cells indicative of a temperature of a monitored component, controlling a controller for controlling a heating or cooling device to adjust the temperature of the monitored component; and controlling an array sensor controller activated by a power source and being in communication with the array sensor and controller.

In some examples, a non-transitory machine-readable medium may include instructions, which when read by a machine, because the machine to perform operations including, at least: operating an array sensor to generate a two-dimensional image, the two-dimensional image including a plurality of pixels in one or more zones of the two-dimensional image, the pixels indicative of a relative temperature of a component; processing data derived from a zone of the one or more zones to generate input data for a controller; and operating the controller to adjust a temperature of the component based on the input data.

Figure 10:
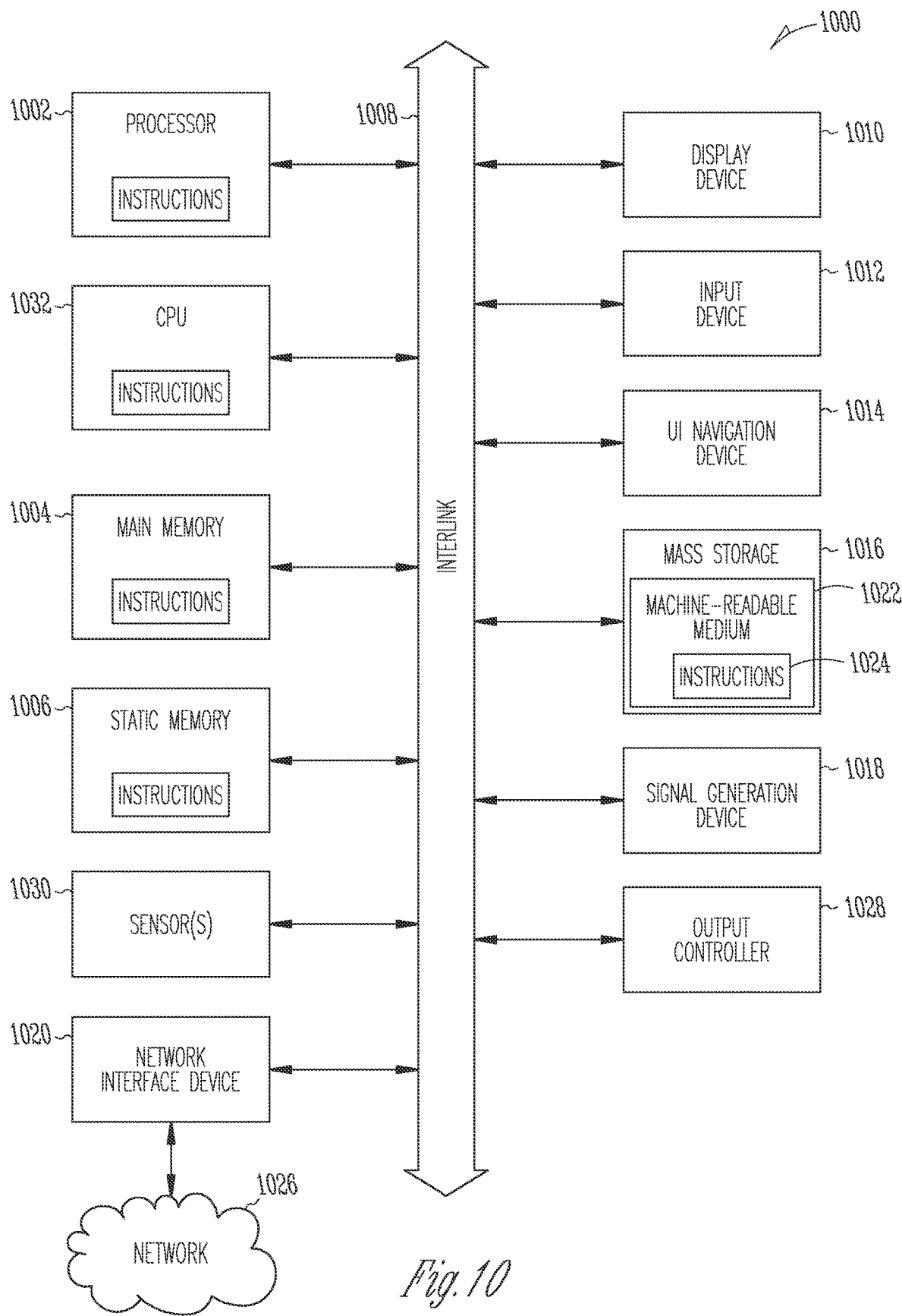
FIG. 10 is a block diagram illustrating an example of a machine upon which one or more example embodiments may be implemented, or by which one or more example embodiments may be controlled.

FIG. 10 is a block diagram illustrating an example of a machine 1000 by which one or more example process embodiments described herein may be controlled. In alternative embodiments, the machine 1000 may operate as a standalone device or may be connected (e.g., networked) to other machines. In a networked deployment, the machine 1000 may operate in the capacity of a server machine, a client machine, or both in server-client network environments. In an example, the machine 1000 may act as a peer machine in a peer-to-peer (P2P) (or other distributed) network environment. Further, while only a single machine 1000 is illustrated, the term "machine" shall also be taken to include any collection of machines that individually or jointly execute a set (or multiple sets) of instructions to perform any one or more of the methodologies discussed herein, such as via cloud computing, software as a service (SaaS), or other computer cluster configurations. In some examples, and referring to FIG. 10, a non-transitory machine-readable medium includes instructions 1024 that, when read by a machine 1000, cause the machine to control operations in methods comprising at least the non-limiting example operations summarized above and described herein.

Examples, as described herein, may include or may operate by logic, or a number of components or mechanisms. Circuitry is a collection of circuits implemented in tangible entities that include hardware (e.g., simple circuits, gates, logic, etc.). Circuitry membership may be flexible over time and underlying hardware variability. Circuitries include members that may, alone or in combination, perform specified operations when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, by moveable placement of invariant massed particles, etc.) to encode instructions of the specific operation. In connecting the physical components, the underlying electrical properties of a hardware constituent are changed (for example, from an insulator to a conductor or vice versa). The instructions enable embedded hardware (e.g., the execution units or a loading mechanism) to create members of the circuitry in hardware via the variable connections to carry out portions of the specific operation when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry, at a different time.

The machine (e.g., computer system) 1000 may include a hardware processor 1002 (e.g., a central processing unit (CPU), a hardware processor core, or any combination thereof), a graphics processing unit (GPU) 1032, a main memory 1004, and a static memory 1006, some or all of which may communicate with each other via an interlink (e.g., bus) 1008. The machine 1000 may further include a display device 1010, an alphanumeric input device 1012 (e.g., a keyboard), and a user interface (UI) navigation device 1014 (e.g., a mouse). In an example, the display device 1010, alphanumeric input device 1012, and UI navigation device 1014 may be a touch screen display. The machine 1000 may additionally include a mass storage device (e.g., drive unit) 1016, a signal generation device 1018 (e.g., a speaker), a network interface device 1020, and one or more sensors 1030, such as a Global Positioning System (GPS) sensor, compass, accelerometer, or another sensor. The machine 1000 may include an output controller 1028, such as a serial (e.g., universal serial bus (USB)), parallel, or other wired or wireless (e.g., IR, near field communication (NFC), etc.) connection to communicate with or control one or more peripheral devices (e.g., a printer, card reader, etc.).

The mass storage device 1016 may include a machine-readable medium 1022 on which is stored one or more sets of data structures or instructions 1024 (e.g., software) embodying or utilized by any one or more of the techniques or functions described herein. The instructions 1024 may as shown also reside, completely or at least partially, within the main memory 1004, within the static memory 1006, within the hardware processor 1002, or within the GPU 1032 during execution thereof by the machine 1000. In an example, one or any combination of the hardware processor 1002, the GPU 1032, the main memory 1004, the static memory 1006, or the mass storage device 1016 may constitute machine-readable media 1022.

While the machine-readable medium 1022 is illustrated as a single medium, the term "machine-readable medium" may include a single medium, or multiple media (e.g., a centralized or distributed database, and/or associated caches and servers) configured to store the one or more instructions 1024.

The term "machine-readable medium" may include any medium that can store, encode, or carry instructions 1024 for execution by the machine 1000 and that cause the machine 1000 to perform any one or more of the techniques of the present disclosure, or that can store, encode, or carry data structures used by or associated with such instructions 1024. Non-limiting machine-readable medium examples may include solid-state memories, and optical and magnetic media. In an example, a massed machine-readable medium comprises a machine-readable medium 1022 with a plurality of particles having invariant (e.g., rest) mass. Accordingly, massed machine-readable media are not transitory propagating signals. Specific examples of massed machine-readable media may include non-volatile memory, such as semiconductor memory devices (e.g., electrically programmable read-only memory (EPROM), electrically erasable programmable read-only memory (EEPROM)) and flash memory devices; magnetic disks, such as internal hard disks and removable disks; magneto-optical disks; and CD-ROM and DVD-ROM disks. The instructions 1024 may further be transmitted or received over a communications network 1026 using a transmission medium via the network interface device 1020.

Although examples have been described with reference to specific example embodiments or methods, it will be evident that various modifications and changes may be made to these embodiments without departing from the broader scope of the embodiments. Accordingly, the specification and drawings are to be regarded in an illustrative rather than a restrictive sense. The accompanying drawings that form a part hereof, show by way of illustration, and not of limitation, specific embodiments in which the subject mater may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The invention claimed is:

1. A temperature control system comprising:
   an array sensor to generate a two-dimensional image, the two-dimensional image including one or more zones, each zone of the one or more zones corresponding to a respective component among a plurality of components of a printed circuit board (PCB) and comprising a plurality of pixels indicative of temperatures of the respective component;
   a controller controlling a heating device and a cooling device to adjust the temperatures of the plurality of components; and
   an array sensor controller activated by a power source and in communication with the array sensor and the controller.

2. The system of claim 1, wherein the controller is configured to generate a benchmark temperature corresponding to the respective component within the each zone and cause the cooling device to adjust the temperatures of the respective component based on the benchmark temperature.

3. The system of claim 2, wherein the cooling device comprises one or more cooling fans with variable fan speeds.

4. The system of claim 1, wherein
   the each zone comprises a zone temperature determined based on the plurality of pixels.

5. The system of claim 1, wherein the two-dimensional image comprising a two-dimensional array of temperature values corresponding to the plurality of pixels.

6. The system of claim 1, wherein the controller comprises remote solid-state relay (SSR) controller.

7. The system of claim 1, wherein the each zone of the one or more zones is associated with a size, area, or location of the component among the plurality of components.

8. The system of claim 1, wherein the each zone of the one or more zones is associated with the controller, the controller being a respective controller among a plurality of controllers.

9. The system of claim 8, wherein
   the respective controller among the plurality of controllers controlling a respective heating device and a respective cooling device to adjust the temperatures of the respective component, the system controlling temperature based on temperature data generated by a single two-dimensional image that includes the one or more zones therein.

10. The system of claim 9, wherein the temperature data generated by the single two-dimensional image is transmitted as feedback to a data processor included in at least one controller in the plurality of controllers.

11. The system of claim 10, wherein the feedback data is compared, by the data processor, against benchmark temperature data.

12. A method for operating an array sensor temperature control system, the method comprising:
generating, by an array sensor, a two-dimensional image, the two-dimensional image including one or more zones, each zone of the one or more zones corresponding to a respective component among a plurality of components of a printed circuit board (PCB) and comprising a plurality of pixels indicative of temperatures of the respective component;
processing data derived from the each zone of the one or more zones to generate input data for a controller; and
operating the controller controlling a heating device and a cooling device to adjust temperatures of the respective component based on the input data.

13. The method of claim 12, further comprising:
generating a benchmark temperature corresponding to the respective component within the each zone; and
causing the cooling device to adjust the temperatures of the respective component based on the benchmark temperature.

14. The method of claim 12, wherein
the cooling device comprises one or more cooling fans with variable fan speeds.

15. The method of claim 12, wherein the each zone comprises a zone temperature determined based on the plurality of pixels.

16. The method of claim 12, wherein the each zone of the one or more zones includes pixels associated with a specific thermal area of a zone.

17. The method of claim 12, wherein the each zone is associated with a size, area, or location of the component.

18. The method of claim 13, wherein the each zone of the one or more zones is associated with the controller, the controller being a respective controller among a plurality of controllers.

19. The method of claim 12, wherein
the respective controller among the plurality of controllers controlling a respective heating device and a respective cooling device to adjust the temperatures of the respective component, the adjusted temperatures based on temperature data generated by a single two-dimensional image that includes the one or more zones therein.

20. A substrate processing system comprising:
a processing chamber;
a power source for the processing chamber; and
a temperature control system for regulating temperatures of one or more components of the substrate processing system, the temperature control system comprising:
an array sensor to generate a two-dimensional image, the two-dimensional image including one or more zones, each zone of the one or more zones corresponding to a respective component among a plurality of components of a printed circuit board (PCB) and comprising a plurality of pixels indicative of temperatures of the respective component;
one or more controllers, each controller of the one or more controllers controlling a respective heating device and a respective cooling device to adjust the temperature of the respective component; and
an array sensor controller in communication with the array sensor and the one or more controllers.

* * * * *